(12) United States Patent
Moon et al.

(10) Patent No.: US 12,270,863 B2
(45) Date of Patent: Apr. 8, 2025

(54) NON-INTRUSIVE, IN-SITU POWER MEASUREMENT METHOD

(71) Applicant: THE FLORIDA STATE UNIVERSITY RESEARCH FOUNDATION, INC., Tallahassee, FL (US)

(72) Inventors: Jinyeong Moon, Tallahassee, FL (US); Lifang Yi, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 108 days.

(21) Appl. No.: 18/146,091

(22) Filed: Dec. 23, 2022

(65) Prior Publication Data

US 2023/0280413 A1   Sep. 7, 2023

Related U.S. Application Data

(60) Provisional application No. 63/266,102, filed on Dec. 28, 2021.

(51) Int. Cl.
*G01R 31/40* (2020.01)
*G01R 21/06* (2006.01)

(52) U.S. Cl.
CPC ............. *G01R 31/40* (2013.01); *G01R 21/06* (2013.01)

(58) Field of Classification Search
CPC ................................ G01R 31/40; G01R 21/06
See application file for complete search history.

(56) References Cited

U.S. PATENT DOCUMENTS

| | | | | |
|---|---|---|---|---|
| 2005/0127881 A1* | 6/2005 | Sase | ...................... | H02M 3/156 323/225 |
| 2009/0140706 A1* | 6/2009 | Taufik | ................. | H02M 3/1584 323/272 |
| 2010/0085029 A1* | 4/2010 | Xie | ........................ | H02M 3/156 323/299 |
| 2012/0153917 A1* | 6/2012 | Adell | .................. | H02M 3/1588 323/283 |
| 2018/0034383 A1* | 2/2018 | Aldhaher | .............. | H03F 3/2176 |
| 2020/0036287 A1* | 1/2020 | Peretz | ................... | H03F 3/2171 |

OTHER PUBLICATIONS

Translation of JP 2019-27811 A (Year: 2019).*

(Continued)

*Primary Examiner* — Paresh Patel
(74) *Attorney, Agent, or Firm* — Eversheds Sutherland (US) LLP

(57) ABSTRACT

A non-intrusive, in-situ power method for measuring the loss associated with magnetic components (for example, an inductor) of a power converter is provided. The method involves first capturing a first set of voltage and current waveforms from the power converter. An additional capacitor is then connected to the power converter and a second set of voltage and current waveforms are captured. Based on the first set of waveforms and the second set of waveforms, a timing skew between the current and voltage waveforms captured from the power converter may be determined. This timing skew may then be used to determine the loss of the inductor. The loss may be used to design an optimized power converter.

17 Claims, 11 Drawing Sheets

(56) References Cited

OTHER PUBLICATIONS

Translation of JP 4423472 B2 (Year: 2010).*
Translation of WO 2016/052487 A1 (Year: 2016).*
The International Search Report and Written Opinion of the International Searching Authority for PCT/US22/53949 dated May 2, 2023. (15 pages).
Lifang Yi, et al.; "Direct in-situ Measurement of Magnetic Loss in Power Electronics Circuits"; IEEE Transactions of Power Electronics, vol. 36, No. 3, p. 3247-3257, published Mar. 2021. (11 pages).
Lifang Yi; "Non-intrusive, In-Situ Power Measurement Method"; PowerPoint Presentation dated Dec. 1, 2021. (15 pages).
Lifang Yi, et al.; "In-Situ Direct Magnetic Loss Measurement with Improved Accuracy for Lossier Magnetics"; IEEE Transactions of Power Electronics, published Feb. 2022. (14 pages).

* cited by examiner

NON-INTRUSIVE, IN-SITU POWER MEASUREMENT METHOD

CROSS-REFERENCE TO RELATED APPLICATIONS

This application claims priority to and benefit of U.S. provisional patent application No. 63/266,102, filed Dec. 28, 2021, which is herein incorporated by reference.

BACKGROUND

Magnetic loss often tops the loss breakdown chart of a power converter. Thus, to improve the effectiveness of power converters, it is important to optimize the design the magnetic components (e.g., an inductor) included within the power converters. However, the verification of these magnetic components must often be performed while the power converter is operating, and it may be difficult to perform verification in-situ during operation. Performing power measurements generally requires measuring voltage and current waveforms and creating a product of these two waveforms using a perfectly aligned time axis. However, an uncertain timing skew (θ) between the measured voltage and current waveforms may introduce an intolerable error in the measured magnetic loss. Misaligned time axes in voltage and current waveforms for power measurement may distort the actual power value, which may severely undermine the credibility of the measurement. In practice, voltage and current waveforms may be sampled through different probes with different sampling circuits, different amplifiers, different cable lengths, different processing algorithms inside the oscilloscope, etc. Given this, the time axes are essentially independent and the effect of the time misalignment, or noted as timing skew, generally overwhelms the real, physical power to be measured.

BRIEF SUMMARY

A non-intrusive, in-situ power measurement method is provided. In one aspect, the method includes: (i) receiving, by one or more processors, a first voltage waveform and a first current waveform associated with a power converter circuit including an inductor; (ii) receiving, using the one or more processors, a second voltage waveform and a second current waveform associated with the power converter circuit including an additional capacitor; (iii) determining, using the one or more processors and based on the first voltage waveform, first current waveform, second voltage waveform, and second current waveform, a first timing skew between voltage and current measurements from the power converter circuit; and (iv) determining, using the one or more processors, a magnetic power loss associated with the inductor of the power converter circuit based on the first timing skew.

In another aspect, a system is provided that includes a processor and a memory storing computer-executable instructions, that when executed by the processor, cause the processor to: (i) receive a first voltage waveform and a first current waveform associated with a power converter circuit including an inductor; (ii) receive a second voltage waveform and a second current waveform associated with the power converter circuit including an additional capacitor; (iii) determine, based on the first voltage waveform, first current waveform, second voltage waveform, and second current waveform, a first tinting skew between voltage and current measurements from the power converter circuit; and (iv) determine a magnetic power loss associated with the inductor of the power converter circuit based on the first timing skew.

In still another aspect, a circuit is provided for testing a magnetic loss of a power converter. In some embodiments, the circuit includes a power converter and an additional capacitor connected to the power converter, wherein a capacitance value of the added capacitor is based on a ratio of a first value and a second value, wherein the first value is determined based on an input voltage and an output voltage of the power converter, and wherein the second value is determined based on an inductance of an inductor of the power converter, a switching frequency of the power converter, and a slop in voltage transition.

BRIEF DESCRIPTION OF THE DRAWINGS

The detailed description is set forth with reference to the accompanying drawings. The use of the same reference numerals indicates similar or identical components or elements; however, different reference numerals may be used as well to indicate components or elements which may be similar or identical. Various embodiments of the disclosure may utilize elements and/or components other than those illustrated in the drawings, and some elements and/or components may not be present in various embodiments. Depending on the context, singular terminology used to describe an element or a component may encompass a plural number of such elements or components and vice versa.

DETAILED DESCRIPTION

A non-intrusive, in-situ power measurement method is provided. Particularly, the in-situ method provides for non-intrusive, precise power measurements to be performed when a target circuit (e.g., power converter) is in operation, while mitigating or eliminating the effects of a timing skew that may occur between the voltage and current waveforms that are measured from the target circuit. Aside from precisely extracted voltage and current waveforms, information about the timing alignment of the voltage and current may be determined using this method based on the circuit topology and expected operation waveforms. This method may be applied to power converters with: (1) non-sinusoidal waveforms, (2) DC-bias, and (3) multiple, local, and minor B-H loops, for example, but may be applicable to other power converters and any other type of device and/or circuit beyond power converters as well. As a direct power measurement method, the method may also accurately account for all nonlinear loss mechanisms of a component (e.g., AC winding loss for magnetics, etc.).

Advances in power semiconductor devices, circuit topologies, and control methods have greatly increased the efficiency and power density of power electronic converters (this term may be used interchangeably with "power converters" herein). However, magnetic components (for example, an inductor) included in these power converters may still be associated with some amount of inefficiency, resulting in magnetic loss in the power converter. Thus, optimization of these magnetic components may be beneficial to increase the efficiency of the power converter. This optimization may also provide other benefits, such as weight and/or size reductions in the power converter.

Figure 6:
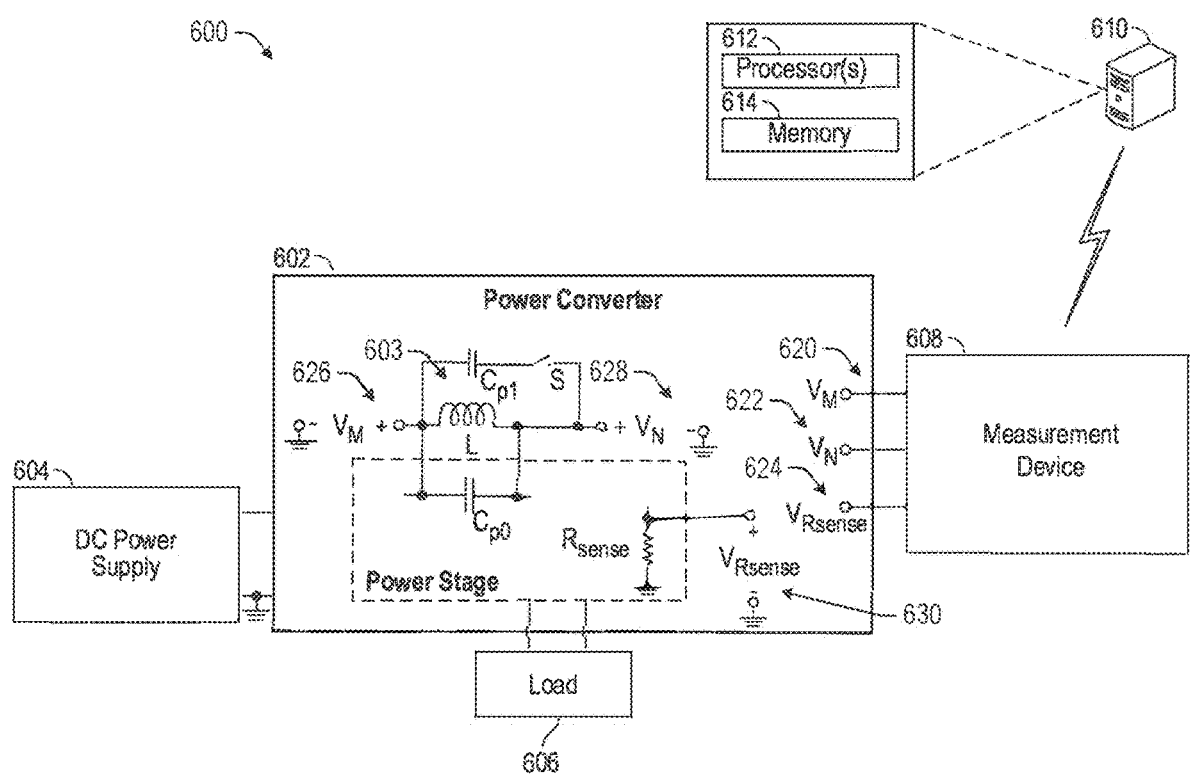
FIG. 6 illustrates an example system, in accordance with one or more embodiments of this disclosure.

To verify the design of the magnetic components, the power loss is obtained while the power converter is operating under intended conditions (for example, operating while being supplied with power and/or connected to a load as shown in FIG. 6). Conventionally, the magnetic loss may often be predicted using the Steinmetz equation or one of its variations based on three key Steinmetz parameters (k, α, and β), which may be provided by manufacturers. The original Steinmetz equation may often not be applicable in practice due to particular shortcomings, such as limitations on sinusoidal excitation in a narrow operating range and difficulties in dealing with DC bias, local and/or multiple magnetic (B-H) hysteresis loops, and winding losses.

Efforts have been made to expand the of the Steinmetz equations. However, with a few fitting parameters, the accuracy of the calculated magnetic loss may only be guaranteed in a relatively narrow range, resulting in power converter optimization challenges. For a specific design, a customized loss map may be established to cover all the intended operation conditions of the magnetic component. However, given that measurements may be required to be performed while the power converter is operating, certain challenges may still be present. Furthermore, regardless of the accuracy of the loss map, the actual loss of the magnetic component may need to be physically measured to validate and close the design loop.

One conventional method to experimentally estimate the magnetic loss of the power converter is referred to as the deduction method. The deduction method is an indirect method that excludes the known losses of all components of the power converter but the magnetic components based on accurate input power. This method requires that the magnetic component is the only component with both AC voltage and current waveforms and the loss mechanism of other components is already established. However, the voltage and current waveforms of the power switches in the power converter may both be associated with AC waveforms and it may be challenging to build precise models to accurately represent their loss mechanisms (for example, field-effect transistor (FET) conduction and switching losses, equivalent series resistance (ESR) losses, and $C_{oss}$ hysteresis losses). Thus, a pinpointed loss estimation may be hindered and only a wide range of potential magnetic loss may be provided by the deduction method.

Another indirect conventional method for determining the loss may involve the use of a calorimeter (e.g., an apparatus used to measure an amount of heat produced). Using this method, the magnetic loss may be determined by the detected temperature rise and corresponding thermal resistance model associated with the operation of the power converter. However, a different dielectric medium (for example, inter-winding capacitance, dielectric loss, etc.) in the measurement environment may change the electrical properties of the magnetic component. Thus, the magnetic component for loss measurement may no longer be identical to the magnetic component during normal operation of the power converter. In addition, the accuracy of the obtained magnetic loss depends on the thermal model (e.g., thermal resistance and capacitance), which results in similar challenges as approaches involving the Steinmetz equations.

Another potential approach may involve obtaining the product of the voltage (V) across and current (I) through a magnetic component (for example, using circuit simulation software). However, this approach may also be hindered by factors such as insufficient signal bandwidth, grounding constraints, differencing resolution, etc. For a component with AC voltage and current waveforms (for example, an inductor in a DC power converter), an unavoidable timing skew between the V/I measurement channels may pose the most significant challenge. The error in the direct measured loss increases linearly with the timing skew, especially for magnetics of a high quality factor in high-frequency applications. A timing skew of only one nanoseconds, for example, could introduce an unacceptable error, making it impractical to calibrate the misalignment visually.

Although it may be difficult to avoid timing skew in the voltage and current measurements performed on the power converter, the direct in-situ magnetic loss measurement is achievable if the error resulting from the timing skew is mitigated or eliminated after the measurement are performed.

Figure 2:
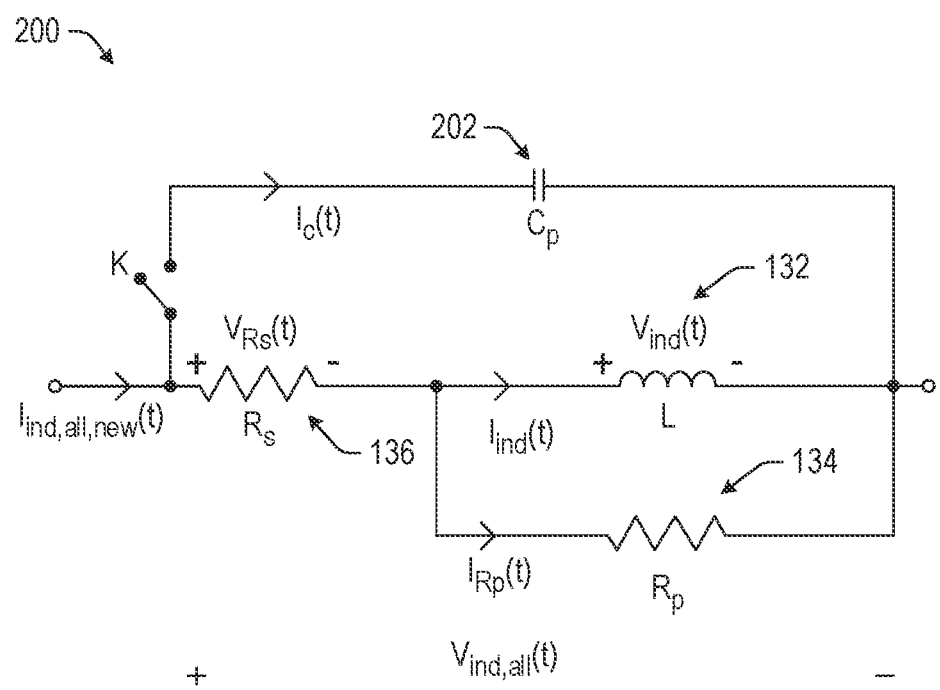
FIG. 2 illustrates an equivalent circuit of a lossy inductor with an external capacitor connected to a power converter, in accordance with one or more embodiments of the disclosure.
Figure 3A:
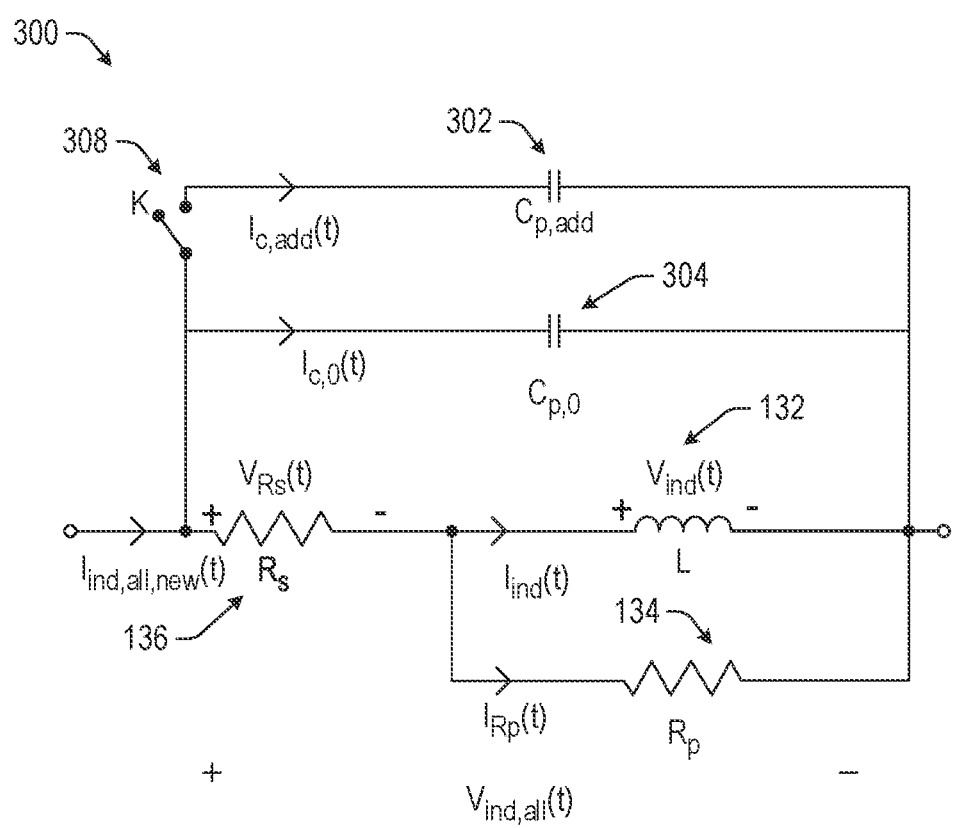
FIGS. 3A-3B illustrate a circuit schematic associated with an external capacitor and a parasitic capacitor, in accordance with one or more embodiments of the disclosure.
Figure 3B:
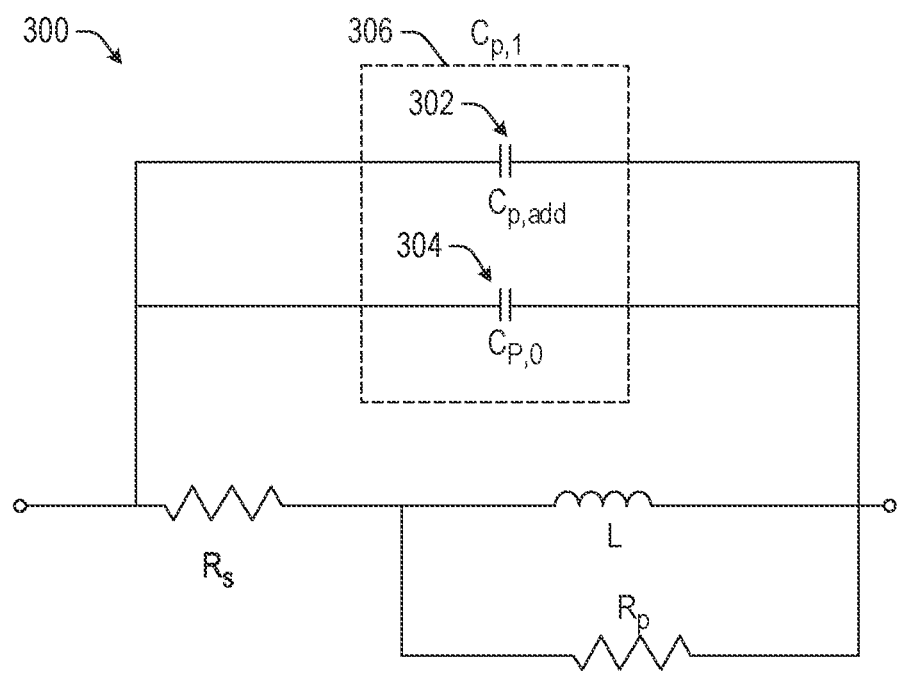

In contrast with the aforementioned conventional approaches for determining the magnetic loss of a power converter, the methods described herein involve minimally-invasive, direct in-situ magnetic loss measurements. The methods may include one or more different approaches. For example, a dual-curve derivative method (the "DCD method" as described herein) may involve adding an extra capacitor in parallel with a lower switch of the half bridge in the power converter (or any other portion of the power converter). This approach is illustrated in FIG. 2. Another method may involve a similar approach, but accounts for the loss mechanism of the inductor using a triple-curve derivative method (the "TCD method" as described herein), which may result in higher accuracy for "lossier" inductors (for example, inductors with a relatively low quality factor). This is accomplished by accounting for parasitic capacitance (shown as $C_{p,0}$ in FIGS. 3A-3B) produced by the inductor in any calculations that are performed. This method is illustrated in FIGS. 3A-3B.

However, the slope of the inductor voltage during transitions may need to be adjusted for both the DCD and TCD methods. A dedicated space in the printed circuit board (PCB) may be required and a relatively large capacitance of several nF may impact the circuit operation. Thus, a third method is described herein that provides for more minimally-invasive direct in-situ magnetic loss measurement. Instead of adjusting the voltage slope, this method (the improved dual-curve derivative method, or the "iDCD method" as described herein) may involve connecting a smaller capacitor of several pF (or any other capacitance) across the inductor to introduce a certain variation to the current waveform during transitions. This may be used to pinpoint the actual timing skew. The extra capacitor may be placed between two ends of the inductor with no extra space requirements for PCB design. Additionally, the adverse effects of a few pF capacitor on the operation of the circuit may be negligible.

Figure 1A:
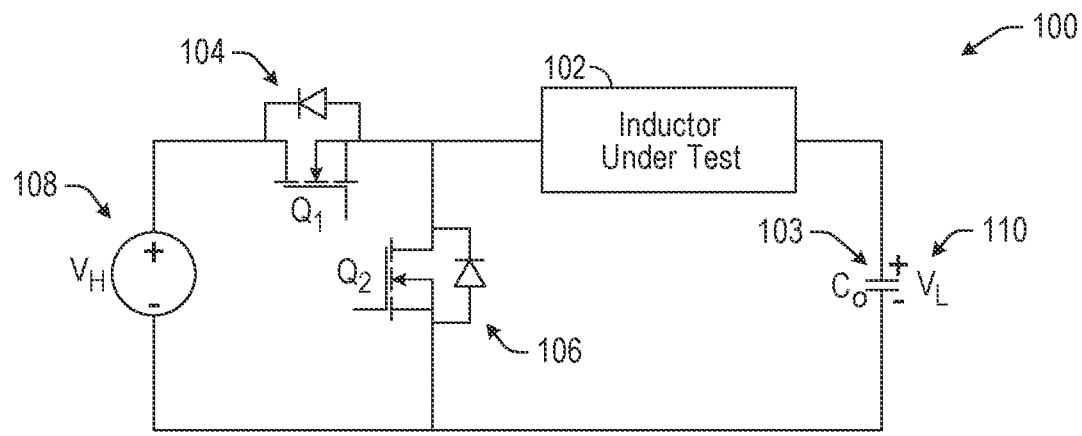
FIG. 1A shows an example circuit schematic for a power converter, in accordance with one or more embodiments of the disclosure.

Turning to the figures, FIG. 1A shows an example circuit schematic 100 for a power converter. FIG. 1A specifically shows a circuit schematic for a buck converter; however, it should be noted that this is merely for illustrative purposes and any other type of power converter may be applicable. In some embodiments, the power converter may include an inductor 102, a capacitor 103, and one or more MOSFETS (for example, MOSFET 104 and MOSFET 106). The first voltage 108 ("$V_H$") may represent the input voltage of the power converter and the second voltage 110 ("$V_L$") may represent the output voltage of the power converter. With reference to any other power converter illustrated herein, "$f$" may represent a switching frequency and "S" may represent a slope in voltage transition.

The inductor 102 is a component that stores energy in a magnetic field when electrical current flows through the inductor 102. The inductor 102 may then supply energy to the circuit to regulate current flow. An inductor 102 is often included in a power converter (sometimes in combination with the capacitor 103) for voltage regulation purposes. The inductor may be a "magnetic component" that is subject to magnetic losses as described herein. Thus, the inductor 102 may be the component of the power converter from which the voltage and current waveforms described herein are obtained.

Figure 1B:
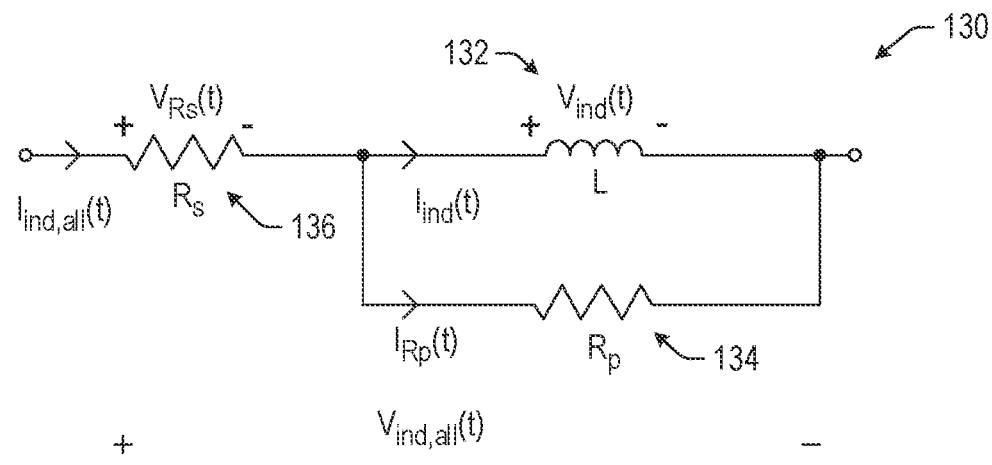
FIG. 1B illustrates an example equivalent circuit of a lossy inductor in a power converter, in accordance with one or more embodiments of the disclosure.

FIG. 1B illustrates an equivalent circuit 130 of a "lossy" inductor in a power converter (such as the power converter shown in FIG. 1A), in accordance with one or more embodiments of the disclosure.

As aforementioned, an inductor may not necessarily operate as an ideal component. The voltage and current waveforms obtained from an inductor may differ from ideal waveforms based on various internal loss mechanisms within the power converter. These loss mechanisms may generally be modeled as a more complicated network of passive components, manifesting as different Kirchhoffs Current Law (KCL) and Kirchhoffs Voltage Law (KVL) internally and changing the original two-port characteristics of the inductor. Conventional methods are based on the voltage and current waveforms of an ideal inductor. In an effort to build a more accurate model, the equivalent circuit 130 of the non-ideal inductor may be used by the methods described herein to account for the loss factor of the inductor 102.

The equivalent circuit 130 thus illustrates an equivalent representation of the inductor 102 as a combination of an "ideal" inductance 132 ("L") and two resistances (for example, a first resistance 134 ("$R_p$") represents the equivalent core resistance of the inductor 102, and a second resistance 136 ("$R_s$") represents the equivalent winding resistance of the inductor 102. $V_{ind}$ (t) represents the waveform associated with the measured voltage across the inductor and $I_{ind}$ (t) represents the waveform associated with the current measured through the inductor. Based on $V_{ind}$(t) and $I_{ind}$ (t), the voltage ($V_{ind,all}$(t) and current ($I_{ind,all}$(t)) waveforms for the inductor as a whole (considering the ideal inductance and two resistances).

Figure 1C:
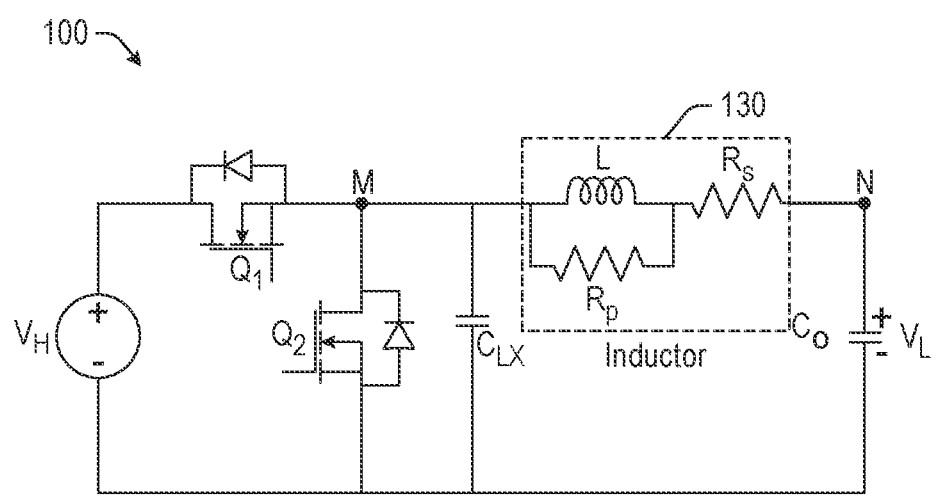
FIG. 1C illustrates an example circuit schematic including an equivalent circuit for an inductor, in accordance with one or more embodiments of the disclosure.

Additionally, FIG. 1C illustrates the circuit schematic 100 including the equivalent circuit 130. That is, the inductor 102 is replaced with the representation including the "ideal" inductance (L) and two resistances ($R_p$ and $R_s$).

FIG. 2 illustrates an equivalent circuit 200 of a "lossy" inductor (for example, an inductor with a relatively low quality factor) with an added capacitor 202 ("$C_p$") in a power converter, in accordance with one or more embodiments of the disclosure. For example, assuming an inductor is operating at 100 kHz with a duty ratio of 0.5 in a buck converter, a timing skew of 0.35 ns could result in a loss measurement error higher than 10% if the quality factor is lower than 374. Thus, a quality factor of 200 at 100 kHz may be considered a relatively low quality factor, for example (however, this is not intended to be limiting). Similar to the equivalent circuit 130 of FIG. 1B, FIG. 2 shows that the added capacitor 202 is connected in parallel with the representation of a non-ideal inductor.

FIG. 3A illustrates a circuit schematic 300 of a power converter with an external capacitor 302 ("$C_{p,add}$") (similar to $C_p$ shown in FIG. 2) that and a second capacitor 304 ("$C_{p,0}$") that represents the parasitic capacitance of the power converter, in accordance with one or more embodiments of the disclosure. FIG. 3B illustrates an overall capacitance 306 ("$C_{p,1}$") that may be determined from the added capacitor also accounting for the parasitic capacitance 304 ("$C_{p,0}$") of the inductor 134.

With respect to the TCD method, for an ideal inductor, the first order derivative of $P_{LOSS}^{Meas}(\theta)$ may be obtained based on Equation 1:

$$\frac{\partial P_{LOSS}^{Meas}(\theta)}{\partial \theta} = \begin{cases} * -\left(\frac{V_L(V_H - V_L)}{L} - \frac{V_H^3 f}{3LS}\right) + \frac{V_H S f}{L}\theta^2 - \frac{S^2 f}{3L}\theta^3 \\ \dagger -\left(\frac{V_L(V_H - V_L)}{L} - \frac{V_H^3 f}{3LS}\right) + \frac{V_H S f}{3L}\theta^2 + \frac{S^2 f}{3L}\theta^3 * \\ \left[\text{For } 0 \leq \theta \leq \frac{V_H}{S}\right], \dagger\left[\text{For } -\frac{V_H}{S} \leq \theta \leq 0\right] \end{cases}$$

(Equation 1)

This is an even function as it satisfies $$\frac{\partial P_{LOSS}^{Meas}(\theta)}{\partial \theta} = \frac{\partial P_{LOSS}^{Meas}(-\theta)}{\partial \theta}$$

with a minimum at θ=0, which may be the absolute zero skew point. Therefore, the actual timing skew with the DCD method, in case of an ideal inductor, may be obtained by finding the minimum point (θ=θ₀) of the first derivative of $P_{LOSS}^{Meas}(\theta)$. However, with the lossy magnetic model, the first derivative of $P_{LOSS}^{Meas}(\theta)$ may not be an even function due to $R_s$ and $R_p$, as previously discussed. In some cases, only when the derivative of the magnetic component is relatively high, the derivative may approach an even function (i.e., Rs→0 and Rp→∞). With the lossy model, the first order derivative of $P_{LOSS}^{Meas,all}(\theta)$ may be obtained, instead of $P_{LOSS}^{Meas}$. Then, the minimum point of $\partial P_{LOSS}^{Meas,all}/\partial\theta$ may be tracked and labeled as θ=$\theta_{nadir}$. Unlike with the ideal model, this minimum point with the lossy model, $\theta_{nadir}$, may not coincide with the absolute zero skew point ($\theta_{real}$). An error term may thus be used to relate $\theta_{nadir}$ to the actual timing skew as shown below:

$\theta_{nadir}=\theta_{real}+\theta_{error}$ (Equation 2)

To determine $\theta_{error}$, the second order derivative of $P_{LOSS}^{Meas,all}(\theta)$ may be calculated as:

$$\frac{\partial^2 P_{LOSS}^{Meas,all}(\theta)}{\partial \theta^2} = \begin{cases} * \frac{R_s V_L(V_L - V_H)}{L^2} + \frac{R_s V_H^3 f}{3L^2 S}\theta^2 - \frac{2V_H fS}{R_p}\left(1 + \frac{R_s}{R_p}\right) + \\ \quad \left(\frac{2V_H Sf}{L} + \frac{2fS^2}{R_p}\left(1 + \frac{R_s}{R_p}\right)\right)\theta + \\ \quad \left(\frac{6R_s V_H Sf}{L^2} - \frac{fS^2}{L}\right)\theta^2 - \frac{R_s fS^2}{3L^2}\theta^3 \\ \dagger \frac{R_s V_L(V_L - V_H)}{L^2} + \frac{R_s V_H^3 f}{3L^2 S}\theta^2 - \frac{2V_H fS}{R_p}\left(1 + \frac{R_s}{R_p}\right) + \\ \quad \left(\frac{2V_H Sf}{L} - \frac{2fS^2}{R_p}\left(1 + \frac{R_s}{R_p}\right)\right)\theta + \\ \quad \left(\frac{6R_s V_H Sf}{L^2} + \frac{fS^2}{L}\right)\theta^2 + \frac{R_s fS^2}{3L^2}\theta^3 * \\ \left[\text{For } 0 \leq \theta \leq \frac{V_H}{S}\right], \dagger\left[\text{For } -\frac{V_H}{S} \leq \theta \leq 0\right] \end{cases}$$

(Equation 3)

Normally, the equivalent parallel resistance of an inductor may be much greater than the equivalent series resistance $$\left(\text{e.g., } \frac{R_s}{R_p} \ll 1\right).$$

However, in some power converters, where the transition time $$\left(\frac{V_H}{S}\right)$$

is in the tens of nanoseconds range (or lower) and the switching frequency ("$f$") may be in the order of MHz (or any other switching frequency), these conditions may translate to the following inequality:

$$\frac{V_H f}{3S} \ll \frac{V_L(V_H - V_L)}{V_H^2}.$$

Then, the previous equation simplifies to:

$$\frac{\partial^2 P_{LOSS}^{Meas,all}(\theta)}{\partial \theta^2} = \frac{R_s V_L(V_L - V_H)}{L^2} - \frac{2V_H f^s}{R_p} + \left(\frac{2V_H Sf}{L} + \frac{2fS^2}{R_p}\right)\theta$$

(Equation 4)

$$\left[\text{For } -\frac{V_H}{S} \leq \theta \leq \frac{V_H}{S}\right]$$

When the first order derivative $\partial P_{LOSS}^{Meas,all}/\partial \theta$, reaches its minimum value, the second order derivative, the above equation may be zero. Solving $$\frac{\partial^2 P_{LOSS}^{Meas,all}(\theta)}{\partial \theta^2} = 0,$$

the resulting $\theta$ indicates the minimum point of $\partial P_{LOSS}^{Meas,all}(\theta)/\partial \theta$. Furthermore, this point may also indicate the error from the absolute zero skew because the absolute zero skew is unmodified from the default $\theta_{real}=0$ in this derivation. Therefore, $\theta_{error}$ is:

$$\theta_{error} = \frac{2V_H fSL^2 + R_p R_s V_L(V_H - V_L)}{2LfS(R_p V_H + LS)}$$

(Equation 5)

$R_s$ and $R_p$ impact $\theta_{error}$ (the displacement of the minimum point from the absolute zero skew point). This may increase an error in the measured loss if the frequency and transition slope become faster. Therefore, it is critical to mitigate or eliminate $\theta_{error}$ to obtain an accurate inductor loss, especially for high-frequency applications. Shown below is an approach that illustrates the importance of the $\theta_{error}$ elimination, from a quality factor standpoint. For different inductors with the same quality factor, there may be multiple combinations of $R_s$ and $R_p$ that have the same power loss under the rectangular voltage waveform, if they satisfy:

$$I_{RMS}^2 R_{eq} = I_{RMS}^2 R_s + \frac{D(1-D)V_H^2}{R_p}$$

(Equation 6)

That is, $$R_p = \frac{12L^2 f^2}{(1-D)D(R_{eq} - R_s)}$$

(Equation 7)

Substituting Equation (7) into Equation (5), $\theta_{error}$ increases with $R_s$ for inductors with the same Q. The maximum $R_s$ (i.e., $R_p=+\infty$ and $R_s=R_{eq}$) leads to the relationship between the maximum $\theta_{error}$ and Q as below:

$$\theta_{error,max} = \frac{V_H}{2} * \frac{\pi D(1-D)}{Q} = t_{dead} * \frac{\pi D(1-D)}{Q}$$

(Equation 8)

where $t_{dead}$ is the duration of the voltage transition $$\left(\text{i.e., } \frac{V_H}{S}\right).$$

The maximum percentage of error in the measured loss with rectangular voltage waveform may be:

$$P_{error,max}[\%] = 6ft_{dead} * 100\%$$

(Equation 9)

Thus, the maximum error in the measured loss directly reported by the minimum point increases with the frequency and the transition duration of the rectangular waveform in a linear fashion. Therefore, it is critical to eliminate $\theta_{error}$ for high-frequency applications. Although the value of $\theta_{error}$ cannot be determined through an individual measurement (because the equivalent resistances of a magnetic component, $R_s$ and $R_p$, are unknown) the Equation (5) still provides an insight that $\theta_{error}$ is always positive and inversely related to the voltage slope (S). By substituting Equation (5) into Equation (2), the relationship between $\theta_{nadir}$ and $\theta_{real}$ is finally obtained as below.

$$\theta_{nadir} = \frac{2V_H f S L^2 + R_p R_s V_L (V_H - V_L)}{2L f S(R_p V_H + LS)} + \theta_{real} \quad \text{(Equation 10)}$$

This equation provides a practical method to find out the actual timing skew, Brea, in the experiment. There are three unknowns in Equation (10): $R_s$, $R_p$, and $\theta_{real}$. Operating the converter with three different voltage slopes and keeping other parameters identical, three sets of $\theta_{nadir}$ and S values can be obtained. The actual timing skew, $\theta_{real}$, is then determined by solving Equation (10) with the three sets of data (or any other number of data sets). In summary, the actual timing skew, $\theta_{real}$, and magnetic loss, $P_{LOSS,1}^{Meas,all}$ ($\theta_{real}$), may be found based on the following steps:

(1) Obtain $V_{L,all_i}(t)$ and $I_{L,all_i}(t)$ with $S_i$ for i=1, 2, 3;
(2) Obtain $[P_{LOSS_i}^{Meas,all}$ vs. $\theta]$ for i=1, 2, 3;
(3) Calculate $[\partial P_{LOSS_i}^{Meas,all}/\partial \theta$ vs. $\theta]$ for i=1, 2, 3;
(4) Find $\theta=\theta_{nadir}$ (min of $\partial P_{LOSS_i}^{Meas,all}/\partial \theta$) for i=1, 2, 3;
(5) Solve Equation 20 with three sets of data to obtain $\theta_{real}$;
(6) Obtain the actual magnetic loss by reading $P_{LOSS_1}^{Meas,all}(\theta_{real})$.

Compared to the DCD method, the TCD method described above may require one more set of current and voltage waveforms. The real timing skew may be obtained by solving equations with data provided by three derivative curves instead of reading from the derivative curve directly. The error introduced by Rp and Rs may be corrected by the derived error model.

Figure 4A:
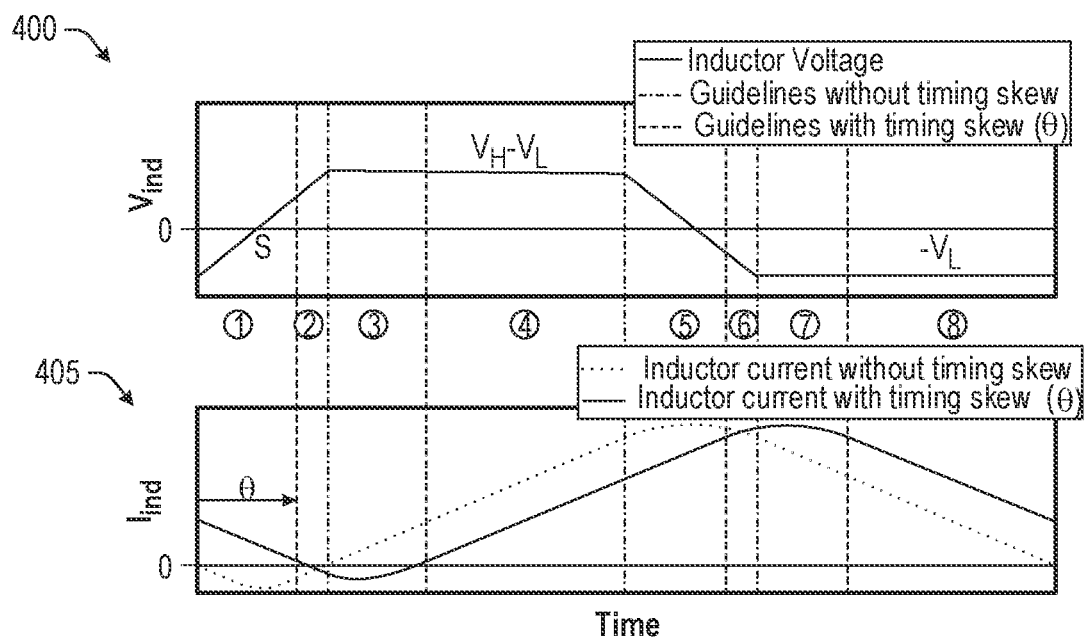
FIGS. 4A-4B illustrate plots of voltage and current waveforms associated with a DC-DC step-up (boost) or step-down (buck) power converter, in accordance with one or more embodiments of the disclosure.
Figure 4B:
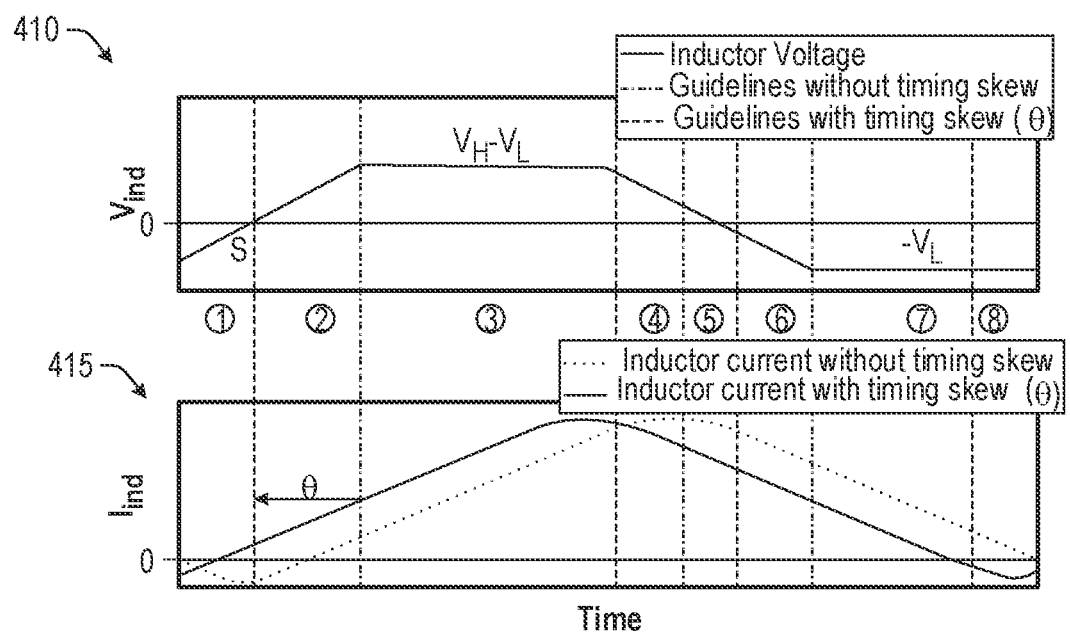

Turning to the iDCD method, an inductor operating in a DC-DC step-down buck converter (however, this is not intended to be limiting) may be considered to build the associated mathematical models. Typical inductor voltage $V_{ind}$ and current $I_{ind}$ waveforms are shown in FIGS. 4A-4B. The voltage waveform may be a rectangular shape (or any other shape) with voltage slopes occurring during transition periods. Since, in some cases, only AC components may impact the sensitivity derivation, the DC bias of the current waveform may be arbitrarily set such that it starts from zero to simply the calculation. A positive timing skew may indicate that the current lags the voltage as shown in FIG. 4A. A negative timing skew may indicate that current leads voltage as illustrated in FIG. 4B. Based on the guidelines with and without timing skew, both voltage and current waveforms in one period may be divided into eight regions as shown in FIGS. 4A-4B. The voltage waveform, $V_{ind}(t)$, may be expressed directly using the variables defined above. The expression of current waveform, $I_{ind}(t)$, may be obtained based on the equation V=L(dI/dt).

TABLE I

Polynomials of $\partial P_{LOSS,1}^{Meas,all}(\theta)/\partial \theta$ in the range $-\frac{V_H}{S} \leq \theta \leq \frac{V_H}{S}$

| Polynomial | $0 \leq \theta \leq \frac{V_H}{S}$ | $-\frac{V_H}{S} \leq \theta \leq 0$ |
|---|---|---|
| $\theta^0$ | $-\left(\frac{V_L(V_H - V_L)}{L} - \frac{V_H^3 f}{3LS}\right)$ | $-\left(\frac{V_L(V_H - V_L)}{L} - \frac{V_H^3 f}{3LS}\right)$ |
| $\theta^1$ | $\frac{R_s V_L(V_L - V_H)}{L^2} + \frac{R_s V_H^3 f}{3L^2 S} - \frac{2V_H f S}{R_p} - \frac{2R_s V_H f S}{R_p^2}$ | $\frac{R_s V_L(V_L - V_H)}{L^2} + \frac{R_s V_H^3 f}{3L^2 S} - \frac{2V_H f S}{R_p} - \frac{2R_s V_H f S}{R_p^2}$ |
| $\theta^2$ | $\frac{V_H S f}{L} + \frac{f S^2}{R_p} + \frac{R_s f S^2}{R_p^2}$ | $\frac{V_H S f}{L} - \frac{f S^2}{R_p} - \frac{R_s f S^2}{R_p^2}$ |
| $\theta^3$ | $\frac{2R_s V_H S f}{L^2} - \frac{f S^2}{3L}$ | $\frac{2R_s V_H S f}{L^2} + \frac{f S^2}{3L}$ |
| $\theta^4$ | $-\frac{R_s f S^2}{12L^2}$ | $\frac{R_s f S^2}{12L^2}$ |

For any component operating in steady state, the sensitivity of average measured loss, $P_{avg}$, to the timing skew may be expressed as:

$$\frac{\partial P_{avg}(\theta)}{\partial \theta} = \frac{\partial}{\partial \theta}\left[\frac{1}{T}\int_{t_0}^{t_0+T} V(t)I(t+\theta)dt\right] \quad \text{(Equation 11)}$$

The expressions of the voltage and current associated with the equivalent circuit 130, $V_{ind,all}$ and $I_{ind,all}$, may be obtained based on the previous expressions of $V_{ind}$ and $I_{ind}$.

$$\begin{cases} I_{ind,all}(t) = I_{ind}(t) + \frac{V_{ind}(t)}{R_p} \\ V_{ind,all}(t) = V_{ind}(t) + \left(I_{ind}(t) + \frac{V_{ind}(t)}{R_p}\right) * R_s \end{cases} \quad \text{(Equation 12)}$$

Thus, the sensitivity of the measured inductor loss based on the lossy inductor model, $P_{LOSS,1}^{Meansall}$, to the timing skew may be obtained as:

$$\frac{\partial P_{LOSS,1}^{Means,all}(\theta)}{\partial \theta} = \frac{\partial}{\partial \theta}\left[\frac{1}{T}\int_{t_0}^{t_0+T} V_{ind,all}(t)I_{ind,all}(t+\theta)dt\right] = \quad \text{(Equation 13)}$$

$$\frac{\partial}{\partial \theta}\left[\frac{1}{T}\int_{t_0}^{t_0+T}\left[\left(1 + \frac{R_s}{R_p}\right)V_{ind}(t)I_{ind}(t+\theta) + \left(1 + \frac{R_p + R_s}{R_p^2}\right)V_{ind}(t)V_{ind}(t+\theta) + \right.\right.$$

-continued $$\theta_{nadir} = \frac{2V_H fSL^2 + R_p R_s V_L(V_H - V_L)}{2LfS(R_p V_H + LS)} + \theta_{real} \quad \text{(Equation 14)}$$

The TCD method may adjust the slope of the voltage waveform multiple times (for example, three times or any other number of times) to obtain sufficient information to calculate the actual timing skew between the voltage and current waveforms by solving Equation (14). In contrast, the additional of a smaller capacitor (e.g., capacitor 202 ("$C_p$") and capacitor 302 ("$C_{p,add}$")) across the inductor may assist in determining the timing skew more concisely. The capacitance value of the added capacitor may be in the pF range. If $C_{p,add}$ is too small, the current dip introduced by $C_{p,add}$ could be drowned out by ripples, causing errors in the result. Conversely, excessive capacitance could make the current ripples more serious, affecting the operation of the converter. In one or more embodiments, the capacitance is appropriate when the additional induced current dip is around 0.5% (however, any other percentage may be used) of the peak-to-peak value of the inductor current. The capacitance value of the capacitor may be determined, in some cases, by Equation 15.

$$C_{p,add} = \frac{V_L(1 - V_L/V_H)}{SLf} * 0.5\% \quad \text{(Equation 15)}$$

The equivalent circuit model when a parallel capacitor $C_p$ is connected is shown in FIG. 2 (the added capacitor is also shown as $C_{p,add}$ in FIGS. 3A-3B and, in some instances, reference to "$C_p$" herein may similarly refer to "$C_{p,add}$"). When $C_p$ is not connected, that is, the switch 308 ("K") is open, the expressions of the voltage and current may be the same as Equation (12). When the switch 308 is closed, the inductor voltage may remain the same. The current through the parallel capacitor, $I_c$, may be expressed as:

$$I_c(t) = C_p \frac{d\left(V_{ind}(t) + \left(I_{ind}(t) + \frac{V_{ind}(t)}{R_p}\right) * R_s\right)}{dt} \quad \text{(Equation 16)}$$

Thus, the new measured current $I_{ind,all,new}$ may be obtained as:

$$I_{ind,all,new}(t) = I_{ind,all}(t) + I_c(t) \quad \text{(Equation 17)}$$

The sensitivity of the measured inductor loss with $C_p$, $P_{LOSS,2}^{Means,all}$, to the timing skew may be calculated as:

$$\frac{\partial P_{LOSS,2}^{Meas,all}(\theta)}{\partial \theta} = \frac{\partial}{\partial \theta}\left[\frac{1}{T}\int_{t_0}^{t_0+T} V_{ind,all}(t)I_{ind,all,new}(t+\theta)dt\right] = \quad \text{(Equation 18)}$$

$$\frac{\partial P_{LOSS,1}^{Meas,all}(\theta)}{\partial \theta} + \frac{\partial P_{LOSS,2}^{Meas,C}(\theta)}{\partial \theta}$$

Where $\partial P_{LOSS,2}^{Meas,C}(\theta)/\partial \theta$ includes derivative items related to C, and may be expressed as:

$$\frac{\partial P_{LOSS,2}^{Meas,C}(\theta)}{\partial \theta} = \frac{\partial}{\partial \theta}\left[\frac{1}{T}\int_{t_0}^{t_0+T} V_{ind,all}(t)I_c(t+\theta)dt\right] \quad \text{(Equation 19)}$$

Combining the expressions of $V_{ind}(t)$, $I_{ind}(t)$, $V_{ind}(t+\theta)$, $I_{ind}(t+\theta)$ and Equation (18) may be calculated as:

$$\frac{\partial P_{LOSS,2}^{Meas,C}(\theta)}{\partial \theta} = \quad \text{(Equation 20)}$$

$$-\frac{2C_p fS^2(R_p + R_s)^2}{R_p^2}|\theta| - \frac{C_p fR_s^3 V_H S}{L^2}\theta^2 + \frac{C_p fR_s^2 S^2}{3L^2}|\theta|^3 + Y$$

$$\left[\text{for} -\frac{V_H}{S} < \theta < \frac{V_H}{s}\right]$$

where Y is a constant value related to $C_p$, independent of $\theta$.

$$Y = C_p f(2V_H S + \frac{4R_s V_H S}{R_p} - \frac{R_s^2 V_L^2}{L^2 f} - \quad \text{(Equation 20)}$$

$$\frac{R_s^2 V_h^3}{3L^2 S} + \frac{2R_s^2 V_H S}{R_p^2} + \frac{R_s^2 V_H V_L}{L^2 f})$$

According to Equation (18), the sensitivity of the measured loss may be increased by $\partial P_{LOSS,2}^{Meas,C}(\theta)/\partial \theta$ when the capacitor $C_p$ is added. For a real inductor, the parasitic capacitance, including turn-to-turn capacitance, and turn-to-core capacitance may not be avoidable. These parasitic capacitances can be represented by a lumped capacitor across the inductor. The additional parallel capacitor $C_{p,add}$ may be connected by closing the switch K. When K is open, the sensitivity of the measured loss with respect to $\theta$, $\partial P_{LOSS,2}^{Meas,0}/\partial \theta$, may be calculated as:

$$\frac{\partial P_{LOSS,2}^{Meas,0}(\theta)}{\partial \theta} = \quad \text{(Equation 21)}$$

$$\frac{\partial}{\partial \theta}\left[\frac{1}{T}\int_{t_0}^{t_0+T} V_{ind,all}(t)[I_{ind,all}(t+\theta)+I_{c,0}(t+\theta)]dt\right] =$$

$$\frac{\partial P_{LOSS,1}^{Meas,all}(\theta)}{\partial \theta} + \frac{\partial P_{LOSS,2}^{Meas,C_p,0}(\theta)}{\partial \theta}$$

Similarly, when K is closed, the sensitivity of the measured loss with respect to $\theta$, $\partial P_{LOSS,2}^{Meas,1}(\theta)/\partial \theta$ may be obtained as:

$$\frac{\partial P_{LOSS,2}^{Meas,1}(\theta)}{\partial \theta} = \quad \text{(Equation 22)}$$

$$\frac{\partial}{\partial \theta}\left[\frac{1}{T}\int_{t_0}^{t_0+T} V_{ind,all}(t)[I_{ind,all}(t+\theta)+I_{c,0}(t+\theta) + I_{c,add}(t+\theta)]dt\right] =$$

$$\frac{\partial P_{LOSS,1}^{Meas,all}(\theta)}{\partial \theta} + \frac{\partial P_{LOSS,2}^{Meas,C_{p,o}}(\theta)}{\partial \theta} + \frac{\partial P_{LOSS,2}^{Meas,C_{p,add}}(\theta)}{\partial \theta}$$

Combining Equations (21) and (22), the difference between the two measured loss sensitivities, $\Delta \partial P_{LOSS,2}^{Meas}(\theta)/\partial \theta$, may be expressed as:

$$\Delta \frac{\partial P_{LOSS,2}^{Meas}(\theta)}{\partial \theta} = \quad \text{(Equation 23)}$$

$$\frac{\partial P_{LOSS,2}^{Meas,0}(\theta)}{\partial \theta} - \frac{\partial P_{LOSS,2}^{Meas,1}(\theta)}{\partial \theta} = \frac{\partial P_{LOSS,2}^{Meas,C_{p,add}}(\theta)}{\partial \theta}$$

According to Equations (19) and (21) $\Delta\partial P_{LOSS,2}^{Meas}(\theta)/\partial\theta$ may be an even function with respect to $\theta$ as it satisfies:

$$\Delta \frac{\partial P_{LOSS,2}^{Meas}(\theta)}{\partial \theta} = \Delta \frac{\partial P_{LOSS,2}^{Meas}(-\theta)}{\partial \theta} \quad \text{(Equation 24)}$$

Also, $\Delta\partial P_{LOSS,2}^{Meas}(\theta)/\partial\theta$ reaches its minimum when $\theta=0$, which theoretically indicates the absolute zero skew point. In one or more embodiments, the parameters of the circuit may be given in Table II, however, this is not limiting

TABLE II

Circuit Parameters for Theoretical Analysis

| $V_H$ | $V_L$ | f | L | $R_p$ | $R_s$ | S | $C_{p,0}$ | $C_{p,add}$ |
|---|---|---|---|---|---|---|---|---|
| 40 V | 20 V | 100 kHz | 6 k | 6 kΩ | 0.2 Ω | 5 V/ns | 5 pF | 10 pF |

Figure 5:
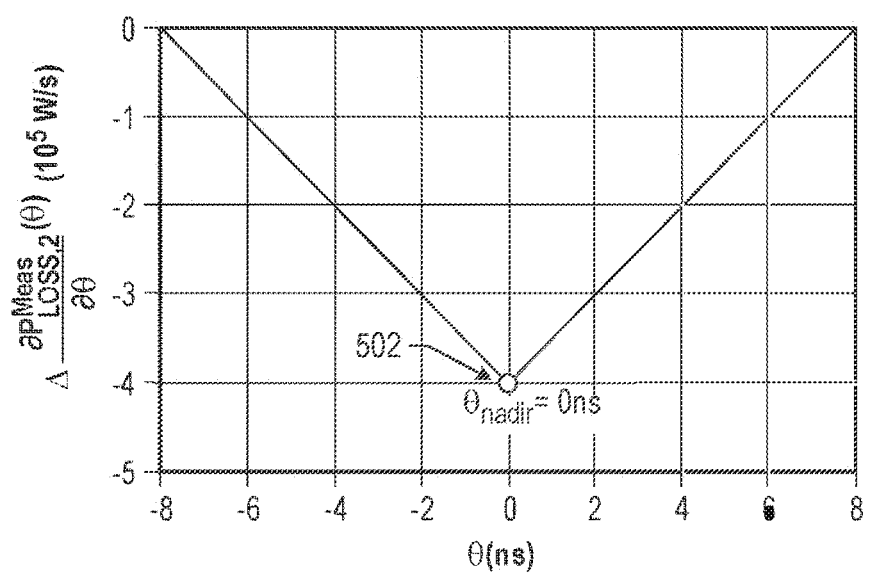
FIG. 5 illustrates a plot of sensitivity of the measured loss, in accordance with one or more embodiments of this disclosure.

If the additional added capacitor is 10 pF (for example), the curve 400 of '$\Delta\partial P_{LOSS,2}^{Meas}(\theta)/\partial\theta$ vs. $\theta$' can be calculated as shown in FIG. 5 based on the previous derivation. The nadir point 502 of the curve successfully pinpoints the location where the absolute timing skew is zero. Thus, the actual timing skew between measurement channels may be determined by the method described herein using following the steps.

(1) Obtain $P_{LOSS,2}^{Meas,0}$ vs. $\theta$ without the additional capacitor $C_{p,add}$;
(2) Obtain $P_{LOSS,2}^{Meas,1}$ vs. $\theta$ without the additional capacitor $C_{p,add}$ across the inductor;
(3) Calculate $\Delta\partial P_{LOSS,2}^{Meas}(\theta)/\partial\theta$ vs. $\theta$;
(4) Find a $\theta=\theta_0$ that achieves the minimum $\Delta\partial P_{LOSS,2}^{Meas}(\theta)$;
(5) Obtain the actual inductor loss by reading $P_{LOSS,2}^{Meas,0}(\theta_0)$.

Since $\partial P_{LOSS,C}(\theta)/\partial\theta$ may be an even function of $\theta$, an improved dual-curve derivative method may also be used to find out the actual timing skew. This method may include two measurements. First, the curve of '$P_{LOSS}^{Meas,all,C_{p,o}}(\theta)$ vs. $\theta$' may be obtained with the initial case. Next, an extra capacitor, $C_{p,add}$, may be connected in parallel with the inductor, which may increase the equivalent parasitic capacitance of the inductor from $C_{p,0}$ to $C_{p,1}$ (this is shown in FIG. 3A). By repeating the measurement, the curve of '$P_{LOSS}^{Meas,all,C_{p,1}}(\theta)$ vs. $\theta$' may be obtained with an added capacitor. Since a small $C_{p,add}$ has a negligible effect on $P_{LOSS,LRR}(\theta)$, the difference between two loss derivative functions can be expressed as below, which may also be an even function of $\theta$.

$$\frac{\partial P_{LOSS}^{Meas,all,C_{p,o}}}{\partial \theta} = \frac{\partial P_{LOSS}^{Meas,LLR,0}}{\partial \theta} + \frac{\partial P_{LOSS}^{Meas,C_{p,o}}}{\partial \theta}$$

$$\frac{\partial P_{LOSS}^{Meas,all,C_{p,1}}}{\partial \theta} =$$

$$\frac{\partial P_{LOSS}^{Meas,LLR,1}}{\partial \theta} + \frac{\partial P_{LOSS}^{Meas,C_{p,1}}}{\partial \theta} * \text{A small } C_{p,add} \text{ has a negligible}$$

$$\text{impact on the slope } S \rightarrow \frac{\partial P_{LOSS}^{Meas,LLR,0}}{\partial \theta} = \frac{\partial P_{LOSS}^{Meas,LLR,1}}{\partial \theta}$$

Dual-curve derivative: $\frac{\partial P_{LOSS}^{Meas,all,C_{p,0}}}{\partial \theta} - \frac{\partial P_{LOSS}^{Meas,all,C_{p,1}}}{\partial \theta} =$ $$\frac{\partial P_{LOSS}^{Meas,C_{p,0}}}{\partial \theta} - \frac{\partial P_{LOSS}^{Meas,C_{p,1}}}{\partial \theta} \text{ even function}$$

After 'P vs $\theta$' curves are determined, the difference of two loss derivative functions (i.e., $\partial P_{LOSS}^{Meas,all}/\partial\theta = \partial P_{LOSS}^{Meas,all,C_{p,o}}/\partial\theta - \partial P_{LOSS}^{Meas,all,C_{p,1}}/\partial\theta$) may be an even function with respect to $\theta$. The minimum point of the '$\Delta\partial P_{LOSS}^{Meas,all}/\partial\theta$ vs. $\theta$' curve may report the actual timing skew ($\theta_{real}$).

$$\frac{\partial P_{LOSS}^{Meas,all,C_p}}{\partial \theta} - \frac{\partial P_{LOSS}^{Meas,all,C_{p,1}}}{\partial \theta} =$$

$$\frac{\partial P_{LOSS}^{Meas,all,C_{p,o}}}{\partial \theta} - \frac{\partial P_{LOSS}^{Meas,C_{p,1}}}{\partial \theta} \rightarrow \frac{\Delta\partial P_{LOSS}^{Meas,all,C_p}}{\partial \theta}$$

TABLE III

| | $\Delta\partial P_{LOSS}^{Meas,all,C_p} / \partial\theta$ | |
|---|---|---|
| | $0 < \theta < \dfrac{V_H}{S}$ | $-\dfrac{V_H}{S} < \theta < 0$ |
| $\theta^0$ | $-C_{p,add} f \left( \dfrac{2V_H S(R_p + R_s)^2}{R_p^2} + \dfrac{R_s^2}{L^2}\left( \dfrac{V_H V_L - V_L^2}{f} - \dfrac{V_H^3}{3S}\right)\right)$ | |
| $\theta^1$ | $\dfrac{2C_{p,add} f S^2 (R_p + R_s)^2}{R_p^2}$ | $-\dfrac{2C_{p,add} f S^2 (R_p + R_s)^2}{R_p^2}$ |
| $\theta^2$ | $\dfrac{C_{p,add} f R_s^3 V_H S}{L^2}$ | $\dfrac{C_{p,add} f R_s^3 V_H S}{L^2}$ |
| $\theta^3$ | $-\dfrac{C_{p,add} f R_s^2 S^2}{3L^2}$ | $\dfrac{C_{p,add} f R_s^2 S^2}{3L^2}$ |

FIGS. 4A-4B illustrates plots of voltage and current waveforms associated with a DC-DC step-up (boost) or step-down (buck) power converter, in accordance with one or more embodiments of the disclosure. In plots 400 and 410, the waveform is the voltage across the ideal inductor ($V_{ind}$). Plots 405 and 415, show the current waveforms ($I_{ind}$) without timing skew ($\theta$) and with timing skew, separately.

FIG. 6 illustrates an example system 600, in accordance with one or more embodiments of this disclosure. Specifically, the system 600 illustrates example components that may be used to perform the non-intrusive, in-situ loss measurements based on the methods described herein. In one or more embodiments, the system 600 may include a power converter 602, a power supply 604, a load 606, a measurement device 608, and a computing system 610.

The power converter 602 may include an inductor 603 (such as inductor 102 shown in FIG. 1A and/or any other inductor described herein or otherwise). The load 606 may also be connected to the power converter 602 such that the power converter 602 may be tested while in operation.

The power supply 604 is configured to provide power to the power converter 602 such that the power converter 602 may be tested while operating. As shown in the figure, the power supply 604 is a DC power supply: however, any other type of power supply may also be used.

The measurement device 608 is a device used to measure the voltage and current values generated by the power converter 602 while the power converter circuit is in operation (for example, when the power supply 604 is supplying power to the power converter 602 and/or the load 606 is connected to the power converter 602). For example, the measurement device 608 may be an oscilloscope; however, any other type of device configured to obtain voltage and current measurements from the power converter 602 may also be used.

To facilitate the measurements, a first measurement probe 620, second measurement probe 622, and third measurement probe 624 of the measurement device 608 may be provided at various points within the power converter 602. For example, the first measurement probe 620 may be provided at the first location 626 in the power converter 602 and may be used to measure the voltage between a leftmost node of the inductor and ground. This measurement is associated with "$V_M$". The second measurement probe 622 may be provided at the second location 628 in the power converter 602 and may be used to measure the voltage between the rightmost node of the inductor and ground. This measurement is associated with "$V_N$". The third measurement probe 624 may be provided at the third location 630 in the power converter 602 and may be used to measure the voltage across the current sense resistor (Rsense). This measurement is associated with $V_{Rsense}$. However, the measurement device 608 may also be used to measure voltage and current values from any other location within the power converter 602 as well. For example, a current probe can be clamped on to any point of the current loop that is in series with an inductor. For example, a differential voltage measurement between the leftmost and rightmost nodes of the inductor (across 626 and 628) may be performed instead of providing $V_M$ and $V_N$.

The computing system 610 may be a local or remote system (for example, a server or other type of system capable of performing computing functions) that may be used to perform any of the functionality described herein with respect to determining a timing skew of a power converter. For example, the computing system 610 may receive any of the voltage and/or current waveforms obtained by the measurement device 608 and may use these waveforms, as well as any other data described herein or otherwise to determine the timing skew. The computing system 610 may also be configured to automatically determine the magnetic loss of the power converter 602 based on the timing skew. The computing system 610 may also be configured to perform any other functions described herein. The computing system may also include one or more processors 612 and memory 614, as well as any other elements described as included within the machine 800.

Figure 7:
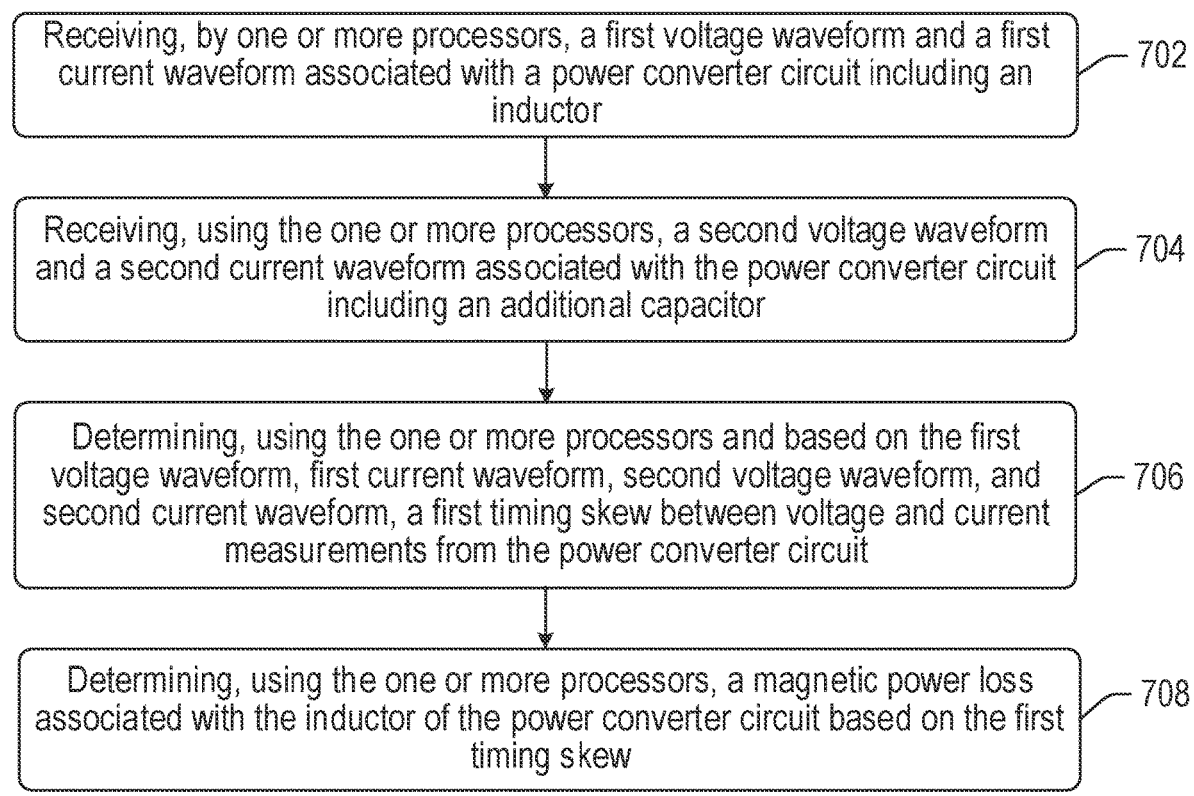
FIG. 7 illustrates an example method, in accordance with one or more embodiments of this disclosure.

FIG. 7 depicts an example method 700 in accordance with one or more embodiments of the disclosure. The method 700 may be performed using computer-executable instructions stored on the memory of a device or system (for example, measurement device 608, computing system 610, machine 800, and/or any other device or system described herein or otherwise).

At block 702 of the process flow 700, computer-executable instructions stored on the memory of a device or system may be executed to receive a first voltage waveform and a first current waveform associated with a first power converter circuit including an inductor. In some cases, the first voltage waveform and the first current waveform may be measured from a power converter that does not include an additional capacitor as shown in FIGS. 3A-3B.

At block 704 of the process flow 700, computer-executable instructions stored on the memory of a device or system may be executed to receive a second voltage waveform and a second current waveform associated with the first power converter circuit including an added capacitor.

In some cases, the second voltage waveform and the second current waveform may be measured from a power converter that does include the additional capacitor. For example, the additional capacitor may be a capacitor that is connected in parallel with the inductor of the power converter. In some instances, the capacitance of the capacitor may be small (for example, in the pF range). In some instances, the capacitance value may be determined based on Equation 15 provided above; however, this is not intended to be limiting.

At block 706 of the process flow 700, computer-executable instructions stored on the memory of a device or system may be executed to determine, based on the first voltage waveform, first current waveform, second voltage waveform, and second current waveform, a first timing skew between voltage and current measurements from the first power converter circuit.

At block 708 of the process flow 700, computer-executable instructions stored on the memory of a device or system may be executed to determine a magnetic power loss associated with the inductor of the first power converter circuit based on the first timing skew.

One or more operations of the methods, process flows, or use cases of FIGS. 1-7 may be described as being performed by a user device, or more specifically, by one or more program module(s), applications, or the like executing on a device. It should be appreciated, however, that any of the operations of the methods, process flows, or use cases of FIGS. 1-7 may be performed, at least in part, in a distributed manner by one or more other devices, or more specifically, by one or more program module(s), applications, or the like executing on such devices. In addition, it should be appreciated that the processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-7 may be described in the context of the illustrative devices, it should be appreciated that such operations may be implemented in connection with numerous other device configurations.

The operations described and depicted in the illustrative methods, process flows, and use cases of FIGS. 1-7 may be carried out or performed in any suitable order as desired in various example embodiments of the disclosure. Additionally, in certain example embodiments, at least a portion of the operations may be carried out in parallel. Furthermore, in certain embodiments, less, more, or different operations than those depicted in FIGS. 1-7 may be performed.

Figure 8:
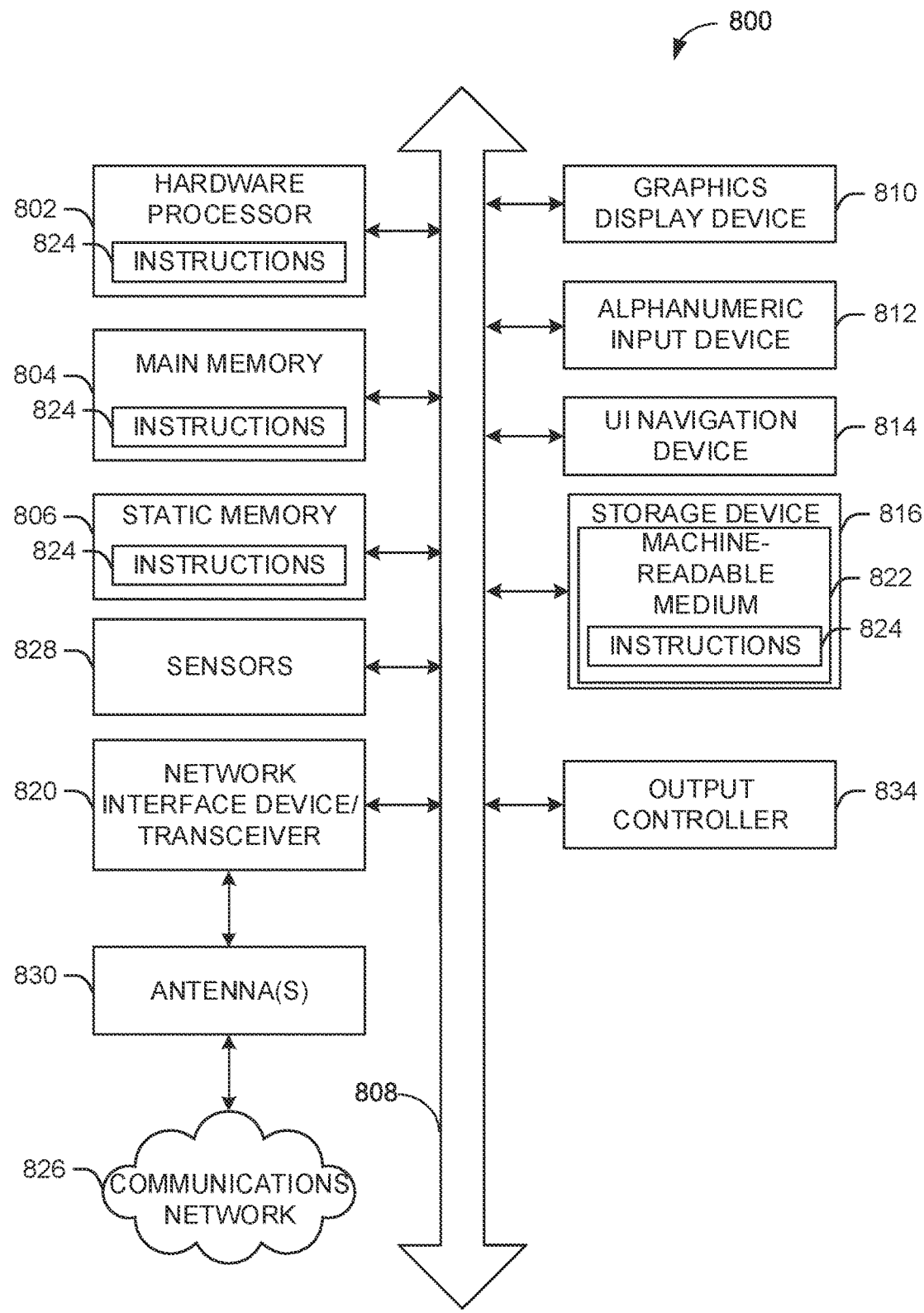
FIG. 8 illustrates an example of a computing system, in accordance with one or more embodiments of this disclosure.

FIG. 8 depicts a block diagram of an example machine 800 upon which any of one or more techniques (e.g., methods) may be performed, in accordance with one or more embodiments of the present disclosure. In other embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environments. The machine 800 may be a personal computer (PC), a tablet PC, a set-top box (STB), a personal digital assistant (PDA), a mobile telephone, a wearable computer device, a web appliance, a network router, a switch or bridge, or any machine capable of executing instructions (sequential or otherwise) that specify actions to be taken by that machine, such as a base station. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired).

In another example, the hardware may include configurable execution units (e.g., transistors, circuits, etc.) and a computer readable medium containing instructions where the instructions configure the execution units to carry out a specific operation when in operation. The configuring may occur under the direction of the executions units or a loading mechanism.

Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine (e.g., computer system) 800 may include a hardware processor 802 (e.g., a central processing unit (CPU), a graphics processing unit (GPU), a hardware processor core, or any combination thereof), a main memory 804 and a static memory 806, some or all of which may communicate with each other via an interlink (e.g., bus) 808. The machine 800 may further include a graphics display device 810, an alphanumeric input device 812 (e.g., a keyboard), and a user interface (UI) navigation device 814 (e.g., a mouse). In an example, the graphics display device 810, alphanumeric input device 812, and UI navigation device 814 may be a touch screen display. The machine 800 may additionally include a storage device (i.e., drive unit) 816, a network interface device/transceiver 820 coupled to antenna(s) 830, and one or more sensors 828, such as a global positioning system (GPS) sensor, a compass, an accelerometer, or other sensor. The machine 800 may include an output controller 834, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, etc.)).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within the static memory 806, or within the hardware processor 802 during execution thereof by the machine 800. In an example, one or any combination of the hardware processor 802, the main memory 804, the static memory 806, or the storage device 816 may constitute machine-readable media.

While the machine-readable medium 822 is illustrated as a single medium, the term "machine-readable medium" may include a single medium or multiple media (e.g., a centralized or distributed database, and/or associated caches and servers) configured to store the one or more instructions 824.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 800 and that cause the machine 800 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 824 may further be transmitted or received over a communications network 826 using a transmission medium via the network interface device/transceiver 820 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 820 may include one or more physical jacks (e.g., Ethernet, coaxial, or phone jacks) or one or more antennas to connect to the communications network 826. In an example, the network interface device/transceiver 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 800 and includes digital or analog communications signals or other intangible media to facilitate communication of such software. The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

Some embodiments may be used in conjunction with one or more types of wireless communication signals and/or systems following one or more wireless communication protocols, for example, radio frequency (RF), infrared (HR), frequency-division multiplexing (FDM), orthogonal FDM (OFDM), time-division multiplexing (TDM), time-division multiple access (TDMA), extended TDMA (E-TDMA), general packet radio service (GPRS), extended GPRS, code-division multiple access (CDMA), wideband CDMA (WCDMA), CDMA 2000, single-carrier CDMA, multi-carrier CDMA, multi-carrier modulation (MDM), discrete multi-tone (DMT), Bluetooth®, global positioning system (GPS), Wi-Fi, Wi-Max, ZigBee, ultra-wideband (UWB), global system for mobile communications (GSM), 2G. 2.5G, 3G, 3.5G, 4G, fifth generation (5G) mobile networks, 3GPP, long term evolution (LTE), LIE advanced, enhanced data rates for GSM Evolution (EDGE), or the like. Other embodiments may be used in various other devices, systems, and/or networks.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, certain systems and methods. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope or spirit thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

What is claimed is:

1. A method comprising:
  receiving, by one or more processors, a first voltage waveform and a first current waveform associated with a power converter circuit including an inductor;
  receiving, using the one or more processors, a second voltage waveform and a second current waveform associated with the power converter circuit including an additional capacitor connected in parallel with the inductor;
  determining, using the one or more processors and based on the first voltage waveform, first current waveform, second voltage waveform, and second current waveform, a first timing skew between voltage and current measurements from the power converter circuit; and determining, using the one or more processors, a magnetic power loss associated with the inductor of the power converter circuit based on the first timing skew.

2. The method of claim 1, wherein a switch is provided between the additional capacitor and the power converter circuit, and wherein the method further comprises:
modifying a position of the switch to a closed position prior to measuring the second voltage waveform and the second current waveform.

3. The method of claim 1, wherein determining the magnetic power loss is further based on a parasitic capacitance of the inductor.

4. The method of claim 1, further comprising:
determining a first plot of a first measured magnetic power loss versus a second timing skew based on the first voltage waveform and the first current waveform;
determining a second plot of a second measured magnetic power loss versus a third timing skew based on the second voltage waveform and the second current waveform;
determining a third plot of a derivative of a third measured power loss versus a fourth timing skew based on the first plot and second plot; and
determining an actual timing skew by identifying a nadir point of the third plot, wherein the first timing skew is based on the actual timing skew.

5. The method of claim 1, wherein a capacitance value of the added capacitor is less than 20 pF.

6. The method of claim 1, wherein a capacitance value of the added capacitor is based on a ratio of a first value and a second value, wherein the first value is determined based on an input voltage and an output voltage of the power converter circuit, and wherein the second value is determined based on an inductance of the inductor, a switching frequency of the power converter circuit, and a slop in voltage transition.

7. The method of claim 1, wherein the first voltage waveform, first current waveform, second voltage waveform, and second current waveform are received while the power converter circuit is connected to a load and under operation.

8. A system comprising:
a processor; and
memory storing computer-executable instructions, that when executed by the processor, cause the processor to:
receive a first voltage waveform and a first current waveform associated with a power converter circuit including an inductor;
receive a second voltage waveform and a second current waveform associated with the power converter circuit including an additional capacitor connected in parallel with the inductor;
determine, based on the first voltage waveform, first current waveform, second voltage waveform, and second current waveform, a first timing skew between voltage and current measurements from the power converter circuit; and
determine a magnetic power loss associated with the inductor of the power converter circuit based on the first timing skew.

9. The system of claim 8, wherein a switch is provided between the additional capacitor and the power converter circuit, and wherein the processor is further configured to computer-executable instructions to:
modify a position of the switch to a closed position prior to measuring the second voltage waveform and the second current waveform.

10. The system of claim 8, wherein determining the magnetic power loss further comprises determining a parasitic capacitance of the inductor.

11. The system of claim 8, wherein the processor is further configured to computer-executable instructions to:
determine a first plot of a first measured magnetic power loss versus a second timing skew based on the first voltage waveform and the first current waveform;
determine a second plot of a second measured magnetic power loss versus a third timing skew based on the second voltage waveform and the second current waveform;
determine a third plot of a derivative of a third measured power loss versus a fourth timing skew based on the first plot and second plot; and
determine an actual timing skew by identifying a nadir point of the third plot, wherein the first timing skew is based on the actual timing skew.

12. The system of claim 8, wherein a capacitance value of the added capacitor is less than 20 pF.

13. The system of claim 8, wherein a capacitance value of the added capacitor is based on a ratio of a first value and a second value, wherein the first value is determined based on an input voltage and an output voltage of the power converter circuit, and wherein the second value is determined based on an inductance of the inductor, a switching frequency of the power converter circuit, and a slop in voltage transition.

14. The system of claim 8, wherein the first voltage waveform, first current waveform, second voltage waveform, and second current waveform are received while the power converter circuit is connected to a load and under operation.

15. A circuit for testing a magnetic loss of a power converter comprising:
a power converter; and
an additional capacitor connected to the power converter, wherein a capacitance value of the added capacitor is based on a ratio of a first value and a second value, wherein the first value is determined based on an input voltage and an output voltage of the power converter, and wherein the second value is determined based on an inductance of an inductor of the power converter, a switching frequency of the power converter, and a slop in voltage transition, wherein the additional capacitor is connected in parallel with the inductor.

16. The circuit of claim 15, wherein a capacitance value of the added capacitor is less than 20 pF.

17. The circuit of claim 15, wherein a switch is provided between the additional capacitor and the power converter.

* * * * *